US009572283B2

(12) United States Patent
Teo et al.

(10) Patent No.: US 9,572,283 B2
(45) Date of Patent: Feb. 14, 2017

(54) THERMALLY CONDUCTIVE FLEXIBLE MEMBER FOR HEAT TRANSFER

(71) Applicant: FINISAR CORPORATION, Sunnyvale, CA (US)

(72) Inventors: Tat Ming Teo, Singapore (SG); Troy Wy Piew Chiang, Singapore (SG); JianBing Zhao, Singapore (SG)

(73) Assignee: FINISAR CORPORATION, Sunnyvale, CA (US)

( * ) Notice: Subject to any disclaimer, the term of this patent is extended or adjusted under 35 U.S.C. 154(b) by 98 days.

(21) Appl. No.: 14/571,071

(22) Filed: Dec. 15, 2014

(65) Prior Publication Data

US 2015/0096732 A1 Apr. 9, 2015

Related U.S. Application Data

(62) Division of application No. 13/352,449, filed on Jan. 18, 2012, now Pat. No. 8,913,388.

(51) Int. Cl.

*H05K 7/20* (2006.01)
*G02B 6/42* (2006.01)
*F28F 3/02* (2006.01)

(52) U.S. Cl.

CPC ............... *H05K 7/2039* (2013.01); *F28F 3/02* (2013.01); *G02B 6/4266* (2013.01); *H05K 7/20* (2013.01); *G02B 6/4281* (2013.01)

(58) Field of Classification Search

CPC ....... G02B 6/4266; G02B 6/4281; H05K 7/20; H05K 7/2039; F28F 3/02

USPC ................................ 361/704, 707, 712, 713

See application file for complete search history.

(56) References Cited

U.S. PATENT DOCUMENTS 4,672,202 A * 6/1987 Crossley, Jr. ........... G01J 5/061 250/238
4,985,805 A * 1/1991 Riedel .................. F25D 19/006 257/680
5,077,637 A * 12/1991 Martorana ......... H05K 7/20545 165/185
5,316,080 A * 5/1994 Banks ..................... F28F 21/02 165/185
5,390,734 A * 2/1995 Voorhes .................. F28F 13/00 165/185
5,510,954 A * 4/1996 Wyler ....................... G06F 1/18 360/99.25

(Continued)

*Primary Examiner* — Anatoly Vortman
(74) *Attorney, Agent, or Firm* — Maschoff Brennan

(57) ABSTRACT

An example embodiment includes a thermal conduction system for dissipating thermal energy generated by operation of an optical subassembly that is disposed within a shell of a communication module. The thermal conduction system can include a thermally conductive flexible member that contacts the optical subassembly and the shell of the communication module. By contacting the optical subassembly and the shell, the thermal energy generated by operation of the optical subassembly can transfer from the optical subassembly to the shell. The thermally conductive flexible member defines thermally conductive flexible member holes that correspond to pins extending from the optical subassembly. The pins pass through the thermally conductive flexible member holes enabling the thermally conductive flexible member to contact the optical subassembly.

17 Claims, 10 Drawing Sheets

100 122 118 102 106 110 112 110 108 116 104 114 120

500 502 530 524 516 518 532 508 540 514 506 526 504 522 542 510 520 548 546

(56) References Cited

U.S. PATENT DOCUMENTS 5,533,256 A * 7/1996 Call .................... H01L 23/3675 174/16.3
5,566,752 A * 10/1996 Arnold .................... F28F 13/00 165/185
5,661,637 A * 8/1997 Villaume ............ F28D 15/0233 165/104.26
6,131,651 A * 10/2000 Richey, III .............. F28F 13/00 165/185
6,209,200 B1 * 4/2001 Campbell ........... F28D 15/0233 29/890.032
6,324,055 B1 * 11/2001 Kawabe ................ G06F 1/1616 361/679.54
6,367,509 B1 * 4/2002 Bonneville ............. F28F 21/02 138/109
6,542,370 B1 * 4/2003 Wang .................... H01L 23/467 165/185
6,922,344 B2 * 7/2005 Meyer-Guldner ... H05K 1/0243 257/697
6,932,518 B2 * 8/2005 Greenlaw .............. H05K 1/025 361/748
7,245,498 B2 * 7/2007 Togami ................ G02B 6/4246 174/350
7,275,937 B2 * 10/2007 Ellison ................. G02B 6/4201 439/67
7,319,590 B1 * 1/2008 Ingram ................. H01L 23/367 257/713
7,417,292 B2 * 8/2008 Weigert ................. H05K 1/147 257/433
7,439,449 B1 * 10/2008 Kumar ................. G02B 6/4292 174/254
7,688,586 B2 * 3/2010 Tomioka ................. G06F 1/203 165/121
2003/0043544 A1 * 3/2003 Nelson ................... A61K 31/00 361/690
2005/0047731 A1 * 3/2005 Hu ....................... G01B 11/272 385/92
2005/0168941 A1 * 8/2005 Sokol ................. H05K 7/20445 361/688
2005/0190545 A1 * 9/2005 Reznik ................... H01R 12/62 361/803
2014/0048240 A1 * 2/2014 Platus ...................... B64G 1/50 165/185

* cited by examiner

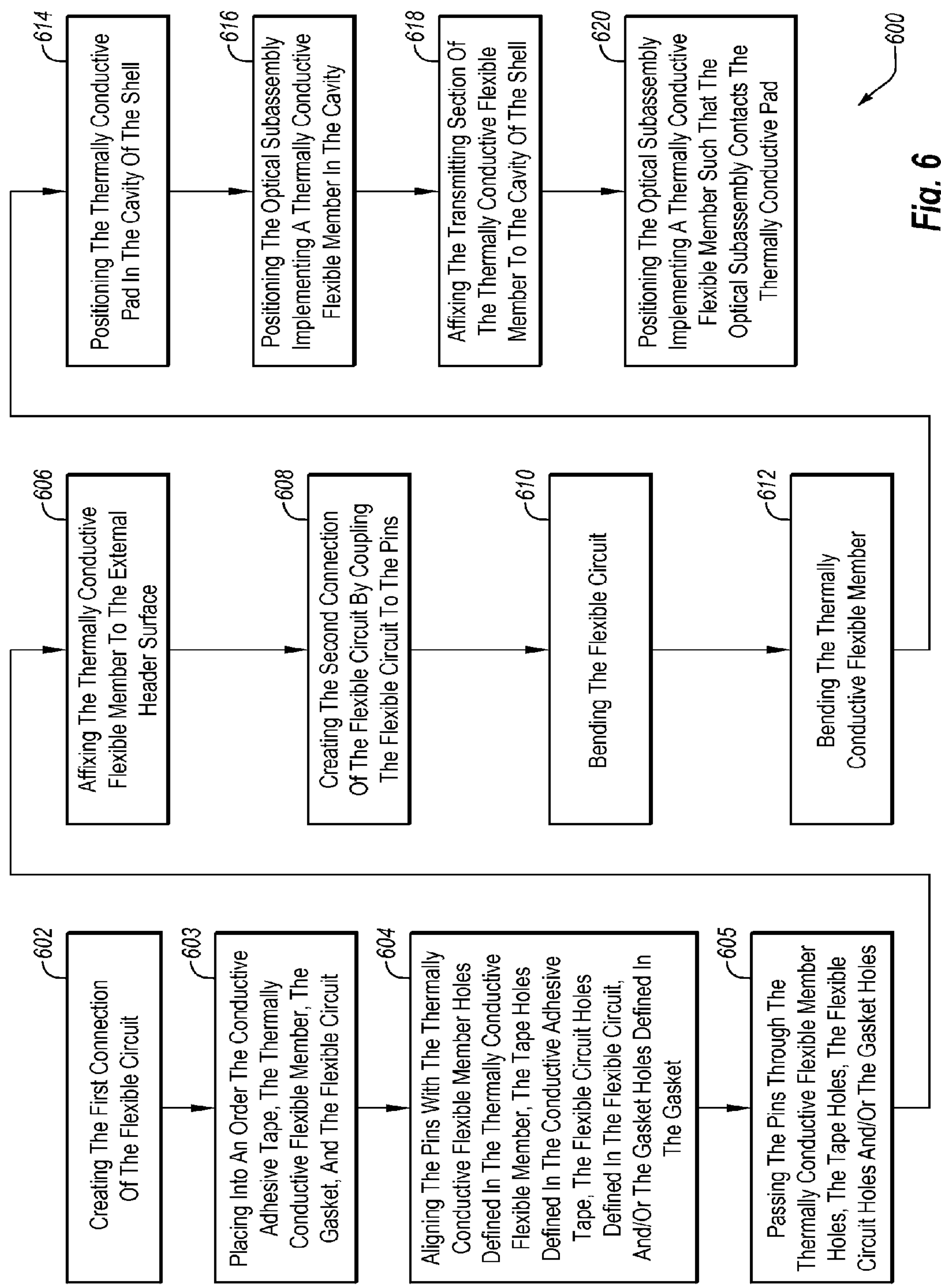
602
Creating The First Connection Of The Flexible Circuit
603
Placing Into An Order The Conductive Adhesive Tape, The Thermally Conductive Flexible Member, The Gasket, And The Flexible Circuit
604
Aligning The Pins With The Thermally Conductive Flexible Member Holes Defined In The Thermally Conductive Flexible Member, The Tape Holes Defined In The Conductive Adhesive Tape, The Flexible Circuit Holes Defined In The Flexible Circuit, And/Or The Gasket Holes Defined In The Gasket
605
Passing The Pins Through The Thermally Conductive Flexible Member Holes, The Tape Holes, The Flexible Circuit Holes And/Or The Gasket Holes
606
Affixing The Thermally Conductive Flexible Member To The External Header Surface
608
Creating The Second Connection Of The Flexible Circuit By Coupling The Flexible Circuit To The Pins
610
Bending The Flexible Circuit
612
Bending The Thermally Conductive Flexible Member
614
Positioning The Thermally Conductive Pad In The Cavity Of The Shell
616
Positioning The Optical Subassembly Implementing A Thermally Conductive Flexible Member In The Cavity
618
Affixing The Transmitting Section Of The Thermally Conductive Flexible Member To The Cavity Of The Shell
620
Positioning The Optical Subassembly Implementing A Thermally Conductive Flexible Member Such That The Optical Subassembly Contacts The Thermally Conductive Pad
600
Fig. 6

THERMALLY CONDUCTIVE FLEXIBLE MEMBER FOR HEAT TRANSFER

CROSS-REFERENCE TO RELATED APPLICATIONS

This application is a divisional of U.S. patent application Ser. No. 13/352,449, filed Jan. 18, 2012, titled THERMALLY CONDUCTIVE FLEXIBLE MEMBER FOR HEAT TRANSFER, which is incorporated herein by reference in its entirety.

BACKGROUND

Field of the Invention

Embodiments described herein relate generally to communication modules. More particularly, example embodiments relate to a communication module that implements one or more thermally conductive members to transfer thermal energy away from an optical subassembly. Thermally conductive members may include a thermally conductive flexible member and/or a thermally conductive pad that may be deformable.

Related Technology

Communication modules, such as electronic or optoelectronic transceivers or transponder modules, are increasingly used in electronic and optoelectronic communication. Each communication module typically communicates with a host device printed circuit board by transmitting and/or receiving electrical data signals to and/or from the host device printed circuit board. The communication module can also transmit electrical data signals outside a host device as optical and/or electrical data signals. Many communication modules include optical subassemblies such as transmitter optical subassemblies (individually, a "TOSA") and/or receiver optical subassemblies (individually, a "ROSA") to convert between the electrical and optical domains.

Generally, a ROSA transforms an optical signal received from an optical fiber or other source to an electrical signal provided to the host device, while a TOSA transforms an electrical signal received from the host device to an optical signal emitted onto an optical fiber or other transmission medium. A photodiode or similar optical receiver contained by the ROSA transforms the optical signal to the electrical signal. A laser diode or similar optical transmitter contained within the optical subassembly is driven to emit an optical signal representing the electrical signal received from the host device.

The process of converting optical signals to electrical signals and electrical signals to optical signals can generate thermal energy in the optical subassembly. The thermal energy generated in the optical subassembly can cause damage to the optical subassembly. Additionally, high-temperature environments can create unstable thermal conditions that can cause ineffective optical subassembly function. For example, high temperature environment can reduce laser performance or can cause premature laser failure. High temperatures may also cause problems to epoxies, solder, and/or other bonding materials in the optical subassembly. These high temperatures may be too great to be effectively dissipated and controlled by a thermoelectric cooler installed in the optical subassembly.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

Embodiments described herein relate generally to communication modules. More particularly, example embodiments relate to a communication module that implements one or more thermally conductive members to transfer thermal energy away from an optical subassembly. Thermally conductive members may include a thermally conductive flexible member and/or a thermally conductive pad that may be deformable.

An example embodiment can include a thermal conduction system for dissipating thermal energy generated by operation of an optical subassembly that is disposed within a shell of a communication module. The thermal conduction system can include a thermally conductive member that contacts the optical subassembly and contacts the shell of the communication module. The thermally conductive member can be configured as a thermally conductive flexible member that can be a flexible strip, and the thermally conductive member can be configured as a thermally conductive pad that may be deformable and optionally have shape memory.

By contacting the optical subassembly and the shell, the thermal energy generated by operation of the optical subassembly can transfer from the optical subassembly to the shell. The thermally conductive flexible member can define thermally conductive flexible member holes that correspond to pins extending from the optical subassembly. The pins pass through the thermally conductive flexible member holes enabling the thermally conductive flexible member to contact a portion of the optical subassembly such as a header from which the pins extend.

Another example embodiment can include an optical subassembly system for transferring thermal energy from an optical subassembly. The optical subassembly system includes an optical subassembly with one or more pins electrically coupled to active optical components disposed within the optical subassembly. The pins extend from the optical subassembly, such as from a header. The optical subassembly system also includes a thermally conductive flexible member that defines thermally conductive flexible member holes, which correspond to the pins. The pins can pass through the thermally conductive flexible member holes enabling the thermally conductive flexible member to contact the optical subassembly, such as an exterior header surface of the header. Contact between the thermally conductive flexible member and the optical subassembly enables conduction of thermal energy from the optical subassembly to the thermally conductive flexible member.

Another example includes an installation process for installing an optical subassembly in a communication module. In the installation process, the optical subassembly includes pins extending from the optical subassembly and a thermally conductive flexible member that transfers thermal energy generated in the optical subassembly from a header of the optical subassembly to a shell of the communication module.

The installation process includes placing a conductive adhesive, such as a conductive adhesive tape, and the thermally conductive flexible member into an order. The order relates to the sequence that the conductive adhesive tape and the thermally conductive flexible member are installed onto the optical subassembly. The conductive adhesive tape defines tape holes and the thermally conductive flexible member defines thermally conductive flexible member holes, both of which correspond to the pins. The tape holes and the thermally conductive flexible member holes are aligned with the pins. The pins are passed through the thermally conductive flexible member holes and the tape holes.

The thermally conductive flexible member is affixed to the header and bent such that the thermally conductive flexible member includes a receiving section affixed to the header and a transmitting section that is thermally coupled to the shell of the communication module. For example, the transmitting section of the thermally conductive flexible member can have a portion that is substantially parallel to the shell of the communication module and in contact therewith. The transmitting section of the thermally conductive flexible member is affixed to a cavity defined by the shell of the communication module. The optical subassembly and thermally conductive flexible member is positioned in the cavity defined by the shell of the communication module so that the optical subassembly is thermally coupled to the shell.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof, which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 6 illustrates a flowchart of an example installation process for installing an optical subassembly implementing a thermally conductive flexible member into a communication module.

DETAILED DESCRIPTION OF SOME EXAMPLE EMBODIMENTS

Figure 1:
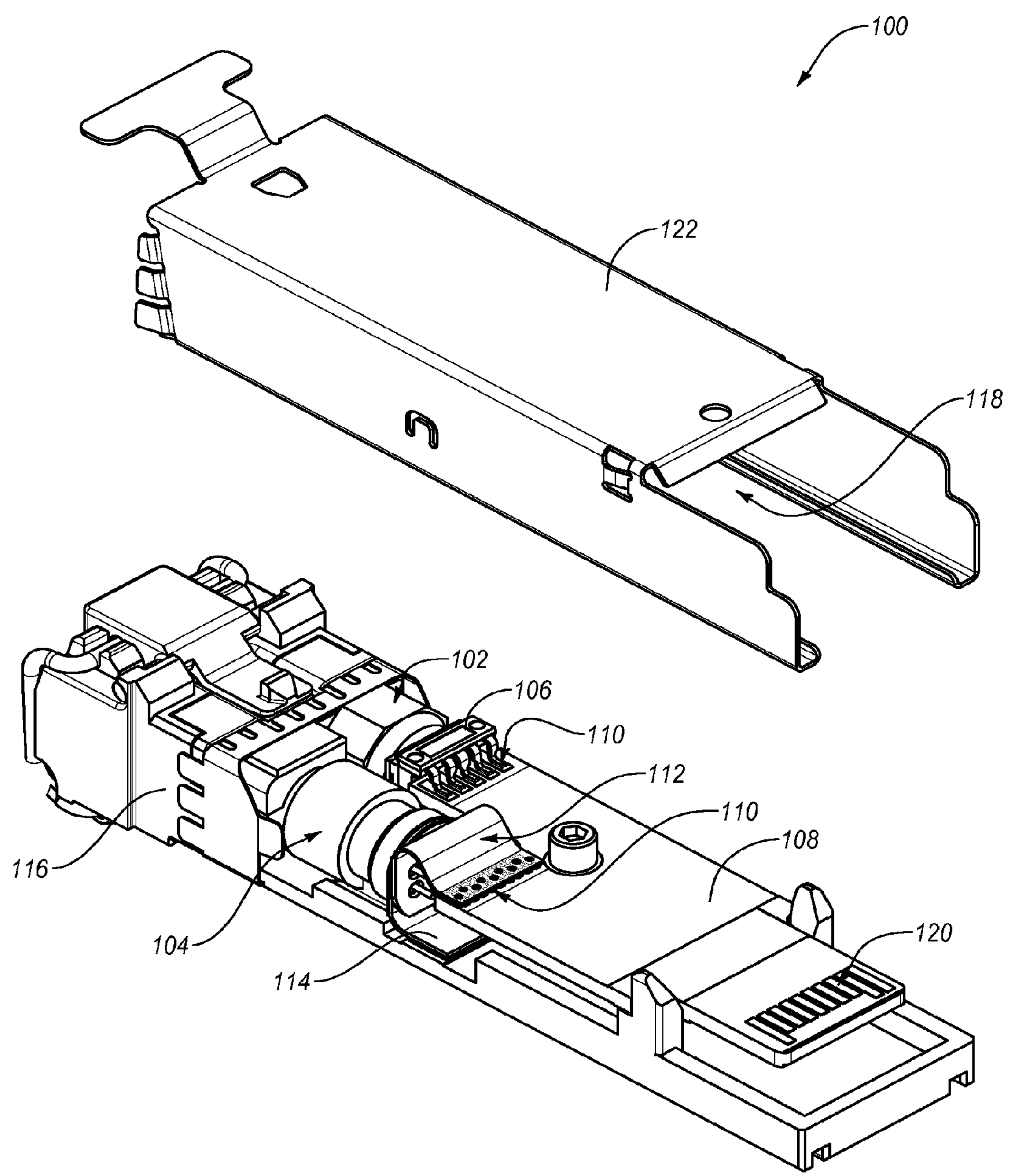
FIG. 1 illustrates a perspective view of an example transceiver in which various features and principle of a thermally conductive flexible member for heat transfer may be implemented.

Embodiments described herein relate generally to communication modules. More particularly, example embodiments relate to a communication module that implements a thermally conductive member to transfer thermal energy away from an optical subassembly. A thermally conductive member can be configured as a thermally conductive flexible member that can be a flexible strip. Additionally or alternatively, a thermally conductive member can be configured as a thermally conductive pad that can be deformable and optionally have shape memory.

In some embodiments, the thermally conductive flexible member defines thermally conductive flexible member holes. The thermally conductive flexible member holes correspond to pins that axially extend from a header of the optical subassembly. The pins pass through the thermally conductive flexible member holes, enabling the thermally conductive flexible member to contact an exterior header surface. The thermally conductive flexible member can be affixed to the external header surface allowing thermal energy generated in the optical subassembly to transfer to the thermally conductive flexible member. Additionally, in some embodiments, the thermally conductive flexible member can contact a shell of a communication module configured to receive the optical subassembly. The contact between the thermally conductive flexible member and the shell allows the transfer of thermal energy from the header to the thermally conductive flexible member and then to the shell. The shell can be situated in a cooling environment further enabling the thermal energy conducted to the shell to be transferred to the cooling environment.

Additionally or alternatively, the thermally conductive pad can be positioned between a header of the optical subassembly and the shell of the communication module configured to receive the optical subassembly. When the communication module is assembled, the thermally conductive pad may contact the header and the shell allowing thermal energy to transfer from the optical subassembly to the thermally conductive pad then to the shell.

In some embodiments, the thermally conductive pad can be deformable. Upon assembly of the optical subassembly into the communication module, the thermally conductive pad may be compressed between the header and shell from an expanded volume to a compressed volume. The thermally conductive pad may be composed of a material that has expansion/compression properties similar to visco-elastic polyurethane foam such as memory foam.

Generally, the embodiments described herein can be implemented in various communication modules including an optical transceiver module ("transceiver") or other devices having the ability to transmit and/or receive optical signals using optical subassemblies.

As used herein, the term "optoelectronic device" includes a device having both optical and electrical components. Examples of optoelectronic devices include, but are not limited to, transponders, transceivers, transmitters, and/or receivers. While the invention will be discussed in the context of cooling a transceiver or an opto electronic device, those of skill in the art will recognize that the principles of the present invention may be implemented in other devices having the functionality similar to that described below.

For example, FIG. 1 illustrates an example transceiver 100 in which various features and principles of a thermally conductive flexible member for heat transfer may be implemented. While the transceiver 100 will be described in some detail, the description is illustrative of an example environment conducive to the implementation of the present invention and not meant to limit or restrict the invention's scope.

As illustrated in FIG. 1, the transceiver 100 may include a ROSA 102, a TOSA 104, a flexible circuit 112, a thermally conductive flexible member 114, a lead frame connector 106, an edge connector 120, electrically conductive pads 110, a shell 116, a shell cover 122, and a printed circuit board ("PCB") 108.

The shell 116 can structurally support the ROSA 102, the TOSA 104, the flexible circuit 112, the thermally conductive flexible member 114, and at least partially the PCB 108 within a cavity 118 that is bounded by the shell 116 and the shell cover 122. The shell cover 122 can be shaped to complement and correspond to the shell 116. When the transceiver 100 is assembled, the shell cover 122 fits onto the shell 116 enclosing the above-mentioned components of the transceiver 100 within the cavity 118.

The transceiver 100 can include the thermally conductive flexible member 114. The thermally conductive flexible member 114 can be configured as a flexible strip of thermally conductive material. The thermally conductive flexible member 114 can be affixed to the TOSA 104 and can contact the shell 116. Because the thermally conductive flexible member 114 is affixed to the TOSA and contacts the shell, the thermally conductive flexible member 114 conducts thermal energy from the TOSA 104 to the shell 116. While not shown, the thermally conductive flexible member 114 can thermally couple the ROSA 102 to the shell 116 in a similar manner. The coupling between the thermally conductive flexible member 114 and the shell 116 can be by contact, adhesive (e.g., thermally conductive adhesive), or other thermally conductive fastener. Various aspects of the thermally conductive flexible member 114 are discussed below with reference to FIG. 3A.

The transceiver 100 can include the flexible circuit 112 to electrically couple the TOSA 104 to the PCB 108. The flexible circuit 112 can be a flexible printed circuit that generally includes, in some embodiments, conductive elements and flexible substrates. The flexible substrates may be composed of materials such as, but not limited to, polyimide, polyester, polyether ether ketone, and/or polyethylene terephthalate ("PET"). In some embodiments, the conductive elements are formed on and/or between the flexible substrates. For example, the flexible circuit 112 can include a copper strip laminated with layers of PET. Alternatively or additionally, the flexible circuit 112 can include a silver circuit that is screen printed on a polyester substrate.

Alternatively or additionally, the flexible circuit 112 may be manufactured similarly to printed circuit boards. These manufacturing methods may include laminating together dielectric layers with epoxy resin, coating the dielectric layers with a conductive layer such as, but not limited to, copper foil, then creating a circuit by removing or chemically etching an unwanted portion of the conductive layer from the dielectric layers.

Generally, the transceiver 100 is configured to enable the communication between a host (not shown) and the ROSA 102 and/or the TOSA 104. To this end, the lead frame connector 106 and the flexible circuit 112 are included to electrically connect the ROSA 102 and the TOSA 104 respectively to the PCB 108 via the electrically conductive pads 110. The edge connector 120 is located at one end of the PCB 108 to enable the transceiver 100 to electrically interface with the host.

The PCB 108 of FIG. 1 can include circuitry and electronic components for use with the TOSA 104 and the ROSA 102 in performing the optical signal transmission and reception activities of the transceiver 100. Among the components of the PCB 108 may be a laser driver, a post amplifier, a controller, and persistent memory (not shown). These components may exist in a single chip or separately disposed on the PCB 108.

The transceiver's 100 principal functions can include communication and conversion of electrical and optical signals. Specifically, electrical data signals received from the host are provided to the laser driver, which drives the TOSA 104 to emit optical data signals representative of the received electrical data signals. Additionally or alternatively, optical data signals can be received by the ROSA 102 which converts the received optical data signals to electrical data signals and provides the electrical data signals to the post amplifier for amplification prior to being communicated to the host via the edge connector 120.

Figure 2:
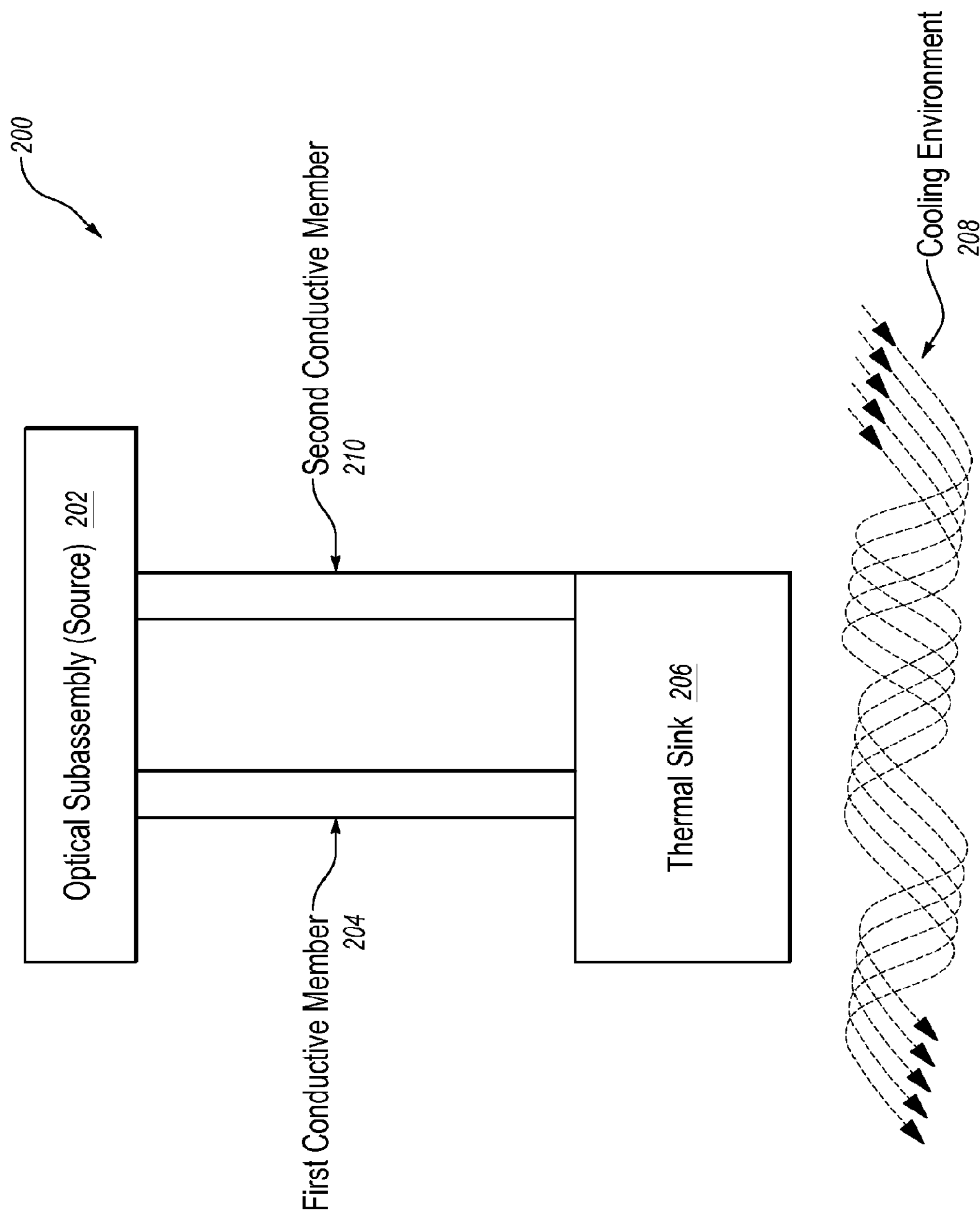
FIG. 2 illustrates a block diagram of an example thermal conduction system that can implement a thermally conductive flexible member.

FIG. 2 illustrates a block diagram of an example thermal conduction system 200 that can implement one or more thermally conductive members such as a thermally conductive flexible member and/or a thermally conductive pad that may be deformable as described herein. As illustrated in FIG. 2, the thermal conduction system 200 can include an optical subassembly 202, a first conductive member 204, a thermal sink 206, and a cooling environment 208. The thermal conduction system 200 depicts a system whereby thermal energy or some portion thereof originating in the optical subassembly 202 can be dissipated to the cooling environment 208. The thermal energy originating in the optical subassembly 202 can include heat generated by operation of the optical subassembly 202. Generally, the thermal energy is conducted from the optical subassembly 202 to the first conductive member 204. The thermal energy is then conducted from the first conductive member 204 to the thermal sink 206. The thermal energy is then dissipated from the thermal sink 206 to the cooling environment 208. Note, the direction the thermal energy moves in the thermal conduction system 200 coincides with thermodynamic convention and is not meant to limit the structure or properties of the embodiments of the inventions described herein.

As mentioned above, the first conductive member 204 is configured to contact the optical subassembly 202. The contact between the first conductive member 204 and the optical subassembly 202 allows conduction of the thermal energy from the optical subassembly 202 to the first conductive member 204. Examples of the first conductive member 204 may include a thermally conductive flexible member or a thermally conductive pad, the details of which are discussed below.

In the thermal conduction system 200, the optical subassembly 202 may be a TOSA or a ROSA that is configured for communication of optical signals in a network (not shown). For example, the optical subassembly 202 may include a TOSA included in a transceiver such as the transceiver 100 of FIG. 1.

Additionally, the first conductive member 204 is configured to contact the thermal sink 206. Similar to the contact between the optical subassembly 202 and the first conductive member 204, because the first conductive member 204 is in contact with the thermal sink 206, the thermal energy may be conducted from the first conductive member 204 and the thermal sink 206.

In this and other embodiments described herein, the thermal sink 206 can be a shell of a communication module. For example, referring to FIG. 1, the thermal sink 206 may include the shell 116 of the transceiver 100.

The thermal sink 206 can be situated in, and thus contact, the cooling environment 208. The cooling environment 208 may include a combination of fluid and/or solid materials, which are generally much larger than the thermal sink 206, such that the thermal energy that conducts from the first conductive member 204 to the thermal sink 206 may be dissipated to the cooling environment 208. The modes of heat transfer between the thermal sink 206 and the cooling environment 208 may be any combination of conduction, convection, and/or radiation.

The cooling environment 208 can include one or more cooling fluids that are static or in motion. The fluids in motion may include for example, ambient, atmospheric air that is propelled over the thermal sink 206. Alternatively, the cooling environment 208 may be static or may periodically be in motion due to an intermittently operating propelling device.

As additionally illustrated in FIG. 2, the thermal conduction system 200 can include a second conductive member 210. Like the first conductive member 204, the second conductive member 210 is configured to contact the optical subassembly 202 and further configured to contact the thermal sink 206. The contact between the second conductive member 210 and the optical subassembly 202 and between the second conductive member 210 and the thermal sink 206 enable the thermal energy originating in the optical subassembly 202 to transfer from the optical subassembly 202 to the thermal sink 206 via the second conductive member 210. Examples of the second conductive member 210 may include a thermally conductive pad or a thermally conductive flexible member, which are described below.

In some embodiments, the thermal conduction system 200 can include both the first conductive member 204 and the second conductive member 210. In embodiments of the thermal conduction system 200 employing both the first conductive member 204 and the second conductive member 210, the thermal energy originating in the optical subassembly 202 may transfer equally through the first conductive member 204 and the second conductive member 210. Alternatively, a majority of the thermal energy may transfer through the first conductive member 204 with a remaining portion of the thermal energy transferring through the second conductive member 210. Alternatively still, a majority of the thermal energy may transfer through the second conductive member 210 with a remaining portion of the thermal energy transferring through the first conductive member 204. For example, the first conductive member 204 may be the thermally conductive flexible member and the second conductive member 210 may be the thermally conductive pad.

In some embodiments of the thermal conduction system 200, the optical subassembly 202 may be made of a first material. Alternatively, a section of the optical subassembly 202 where the first conductive member 204 and/or the second conductive member 210 contact the optical subassembly 202 may be made of the first material. The first material may be selected based upon the first material's physical/chemical properties. For example, the first material may be selected to optimize the first material's thermal expansion properties during hot and cold operation. Alternatively, the first material may be selected to minimize the first material's thermal conductivity. For example, the first material may be an iron-nickel-cobalt alloy, such as Kovar. Alternatively still, the first material may be some other alloy or substance selected for other material properties consistent with the function of the thermal conduction system 200 as described herein.

In some embodiments of the thermal conduction system 200, the first conductive member 204 and/or the second conductive member 210 may be made of a second material. Like the first material, the second material may be selected based upon the second material's physical/chemical properties. For example, the second material maybe selected to optimize the second material's thermal conductivity, such as copper or aluminum or other similarly conductive metals as well as thermally conductive polymers. Alternatively, the second material may be some other substance selected for other material properties consistent with the function of the thermal conduction system 200.

In some embodiments, the first material of the optical subassembly 202 may be selected such that the second material's thermal conductivity is higher than the first material. In this embodiment, the thermal energy can efficiently transfer from the optical subassembly 202 to the first conductive member 204 and/or the second conductive member 210 due to the disparity in the thermal conductivity between the first material and the second material.

Figure 3B:
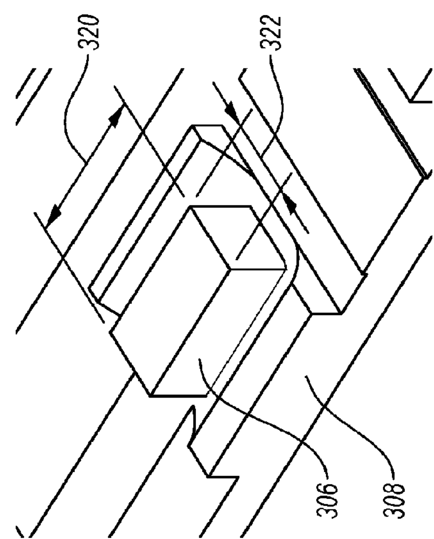
FIGS. 3A and 3B illustrate example conductive members for use in the thermal conduction system depicted in FIG. 2.
Figure 3A:
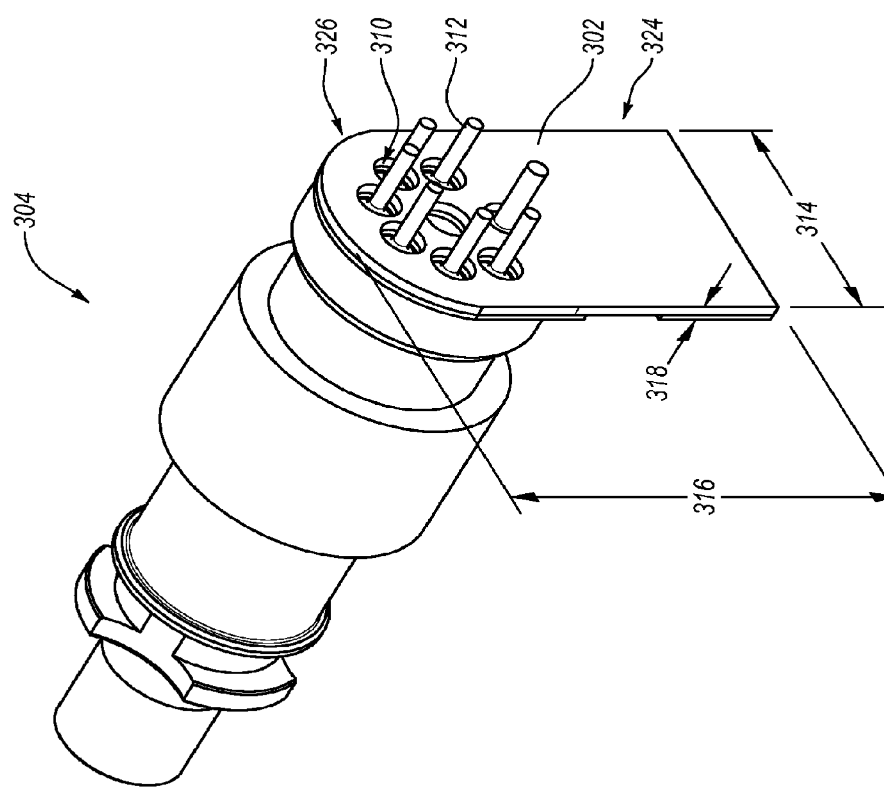

FIGS. 3A and 3B illustrate example conductive members for use in the thermal conduction system 200 depicted in FIG. 2. Specifically, FIG. 3A depicts a thermally conductive flexible member 302, and FIG. 3B depicts a thermally conductive pad 306. One or both of the thermally conductive flexible member 302 and the thermally conductive pad 306 may be implemented to transfer thermal energy from an optical subassembly 304 to a thermal sink such as a shell 308.

As illustrated in FIG. 3A, the thermally conductive flexible member 302 can be a thin strip of pliable or semi-pliable material having thermal conductive properties. The thin strip configuration generally describes a shape with lengths in two dimensions substantially greater than in the third dimension so as to appear flat or sheet-like. For example, the thermally conductive flexible member 302 can include a strip length 314 and a strip height 316 which are significantly greater than a strip width 318, which appears as a thin strip of material.

Additionally, the thin strip configuration of the thermally conductive flexible member 302 can be generally free of additionally geometries or components attached. In the depicted embodiment, the thermally conductive flexible member 302 has a general cross-sectional shape including a circular portion and a rectangular portion. In alternative embodiments, the particular cross-sectional geometry may vary. However, modifications, additional geometries, or components can be associated with the thermally conductive flexible member 302.

The thermally conductive flexible member 302 can include a receiving section 326 and a transmitting section 324. In the embodiment depicted in FIG. 3A, the circular portion corresponds to the receiving section 326 and the rectangular portion corresponds to the transmitting section 324. The receiving section 326 can define thermally conductive flexible member holes 310. The thermally conductive flexible member holes 310 can correspond to pins 312 extending from the optical subassembly 304. Because of the correspondence between the thermally conductive flexible member holes 310 and the pins 312, the pins 312 can pass through the thermally conductive flexible member holes 310. The receiving section 326 of the thermally conductive flexible member 302 can therefore contact the optical subassembly 304, such as by contacting a header of the optical subassembly 304 as shown.

As illustrated in FIG. 3A, the thermally conductive flexible member holes 310 can include a cross-section and/or dimension greater that the corresponding cross-section or dimension of the pins 312 so as to have a gap therebetween. The difference between the cross-section and/or dimension of the pins 312 and the thermally conductive flexible member holes 310 may reduce or eliminate the transfer of electrical signals carried in the pins 312 from being inadvertently communicated from the pins 312 to the thermally conductive flexible member 302. Also, while not shown, an electrically isolating material can be filled in the thermally conductive flexible member holes 310 to electrically isolate the pins 312 from the thermally conductive flexible member 302.

Alternatively, the thermally conductive flexible member holes 310 and the pins 312 can be cooperatively cross-sectioned or dimensioned such that the pins 312 physically contact portions of the thermally conductive flexible member 302 defining the thermally conductive flexible member holes 310. In such embodiments, the pins 312 and/or the thermally conductive flexible member 302 may include an electrically isolative material to limit or eliminate inadvertent electrical communication between the pins 312 and the thermally conductive flexible member 302.

The contact between the optical subassembly 304 and the receiving section 326 enables the transfer of thermal energy via conduction from the optical subassembly 304 to the receiving section 326 of the thermally conductive flexible member 302. For example, in FIG. 3A, the receiving section 326 of the thermally conductive flexible member 302 contacts an exterior header surface of the optical subassembly 304.

With combined reference to FIGS. 3A and 3B, the transmitting section 324 of the thermally conductive flexible member 302 extends from the receiving section 326. The thermal energy transferred from the optical subassembly 304 enters the thermally conductive flexible member 302 at the receiving section 326. The thermal energy then conducts throughout the thermally conductive flexible member 302, ultimately heating the transmitting section 324 of the thermally conductive flexible member 302. When assembled in a communication module, the transmitting section 324 can contact the shell 308 to transfer the thermal energy from the optical subassembly 304 to the shell 308 via thermal conduction. In some embodiments, the thermally conductive flexible member 302 can be bent such that at least a portion of the transmitting section 324 is substantially normal to at least a portion of the receiving section 326 and substantially parallel to the shell 308. FIGS. 1 and 3C-3E illustrate such a bent configuration. Also, the bending of the thermally conductive flexible member 302 can be at any angle from 0 to 90 degrees, acute or obtuse.

Figure 3C:
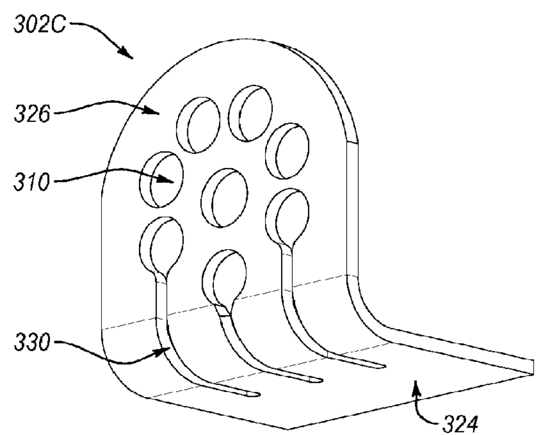
FIGS. 3C-3E illustrate example structures of the thermally conductive flexible member depicted in FIG. 3A.
Figure 3D:
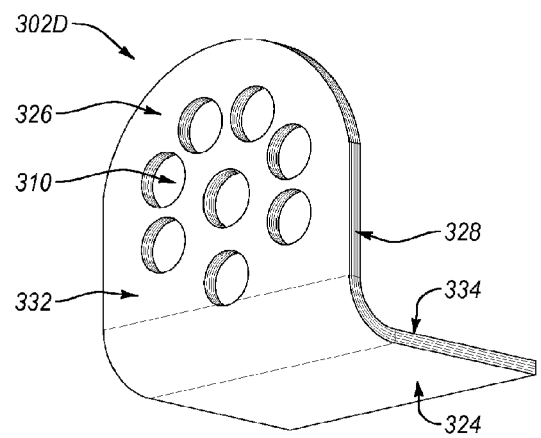
Figure 3E:
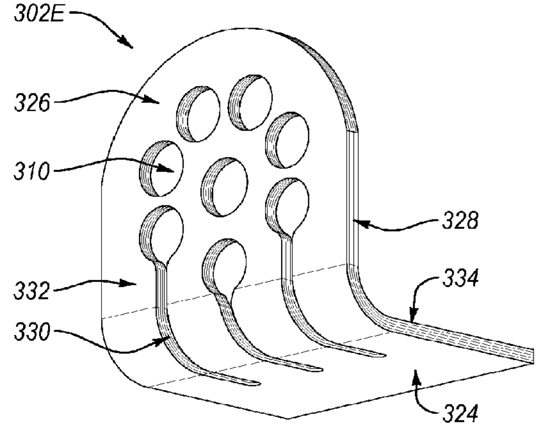

The thermally conductive flexible member 302 depicted in FIG. 3A may include various structures. For example, FIGS. 3C-3E illustrate three thermally conductive flexible member structures (collectively "flexible member structures") 302C, 302D, and 302E. Specifically, FIG. 3C illustrates a perspective view of a slotted thermally conductive flexible member structure ("slotted structure") 302C. FIG. 3D illustrates a perspective view of a layered thermally conductive flexible member structure ("layered structure") 302D. And FIG. 3E illustrates a perspective view of a slotted and layered thermally conductive flexible member structure ("slotted/layered structure") 302E.

Similar to the thermally conductive flexible member 302 depicted in FIG. 3A, the flexible member structures 302C, 302D, 302E illustrated in FIGS. 3C-3E can include the thermally conductive flexible member holes 310, the receiving section 326, and the transmitting section 324. Additionally, as illustrated in the slotted structure 302C, the thermally conductive flexible member 302 may include slots 330. More particularly, the slotted structure 302C can include slots 330 that can connect to the thermally conductive flexible member holes 310. The slots 330 can extend from one or more of the thermally conductive flexible member holes 310 defined in the receiving section 326 to the transmitting section 324. In the illustrated embodiment, three slots 330 extend from three of the thermally conductive flexible member holes 310. However, the slots 330 do not extend through the end of the transmitting section 324 and instead leave a portion of the transmitting section 324 without the slots 330.

In alternative embodiments, there may be any number of slots 330 that may or may not extend from one or more of the thermally conductive flexible member holes 310. Additionally or alternatively, one or more of the thermally conductive flexible member holes 310 may substantially merge into one or more of the slots 330 without a clear distinction made between the thermally conductive flexible member hole(s) 310 and the slot(s) 330.

As depicted in FIG. 3C, the slots 330 may include a generally rectangular cross-section with a long first dimension and a shorter second dimension. However, the generally rectangular cross-section is not limiting and the dimensions and cross-sectional shape of the slots 330 may vary.

Functionally, the slots 330 may allow the conduction of thermal energy into the volume removed in the creation of the slots 330. Additionally or alternatively, the slots 330 may relieve some portion of stresses introduced into the thermally conductive flexible member 302 when the thermally conductive flexible member 302 is bent, as discussed above.

In another example, the thermally conductive flexible member 302 may include the layered structure 302D. The layered structure can include one or more layers 328 having substantially identical shapes stacked upon each other. The one or more layers 328 can be laminated or otherwise affixed together. In alternative embodiments, one or more layers 328 may have differing shapes and/or may be partially affixed together and/or may rely on a compression force introduced when the thermally conductive flexible member 302 is bent to maintain a generally stacked configuration.

Functionally, the layers 328 may be composed of varying material and/or similar materials of various thicknesses. By varying the materials and/or the thicknesses of the layers 328, the layered structure 302D can, for example, enable differing thermal properties on an inner surface 332 and an outer surface 334. For example, the layer 328 disposed as the inner surface 332 may be composed of a material having a high coefficient of thermal conductivity while the layer 328 disposed as the outer surface 334 may be composed of a second material having a low coefficient of thermal conductivity. Through varying the materials of the various layers 328, the transfer and/or dissipation of thermal energy may be better controlled. Additionally or alternatively, by varying the materials and/or the thicknesses of the layers 328, the layered structure 302D can control the stresses introduced by bending the thermally conductive flexible member 302.

In another example, the thermally conductive flexible member 302 may include the slotted/layered structure 302E.

The slotted/layered structure 302E can include one or more layers 328 that may include slots 330. That is, the slotted/layered structure 302E may include one or more layers 328 that include slots 330 as well as one or more layers 328 without slots 330. For example, the layer 328 disposed as the inner surface 332 may include a slot 330, but perhaps the layer 328 disposed as the outer surface 334 may not include slots 330. The slotted/layered structure 302E may have the benefits of both the slotted structure 302C and the layered structure 302D.

As illustrated in FIG. 3B, the thermally conductive pad 306 may take a simple geometric shape. In fact, the thermally conductive pad 306 can have any shape and any suitable dimension in order to function for thermal conduction as described herein. For example, the thermally conductive pad 306 is substantially a rectangular block. A simple geometric shape may reduce the costs associated with manufacturing the thermally conductive pad 306. In alternative embodiments, the thermally conductive pad 306 may take any other geometric shape. In some embodiments, a pad length 320 and a pad width 322 can vary to correspond to a portion of the optical subassembly 304 that contacts the thermally conductive pad 306. For example, if the optical subassembly 304 generates and/or retains thermal energy where the optical subassembly 304 contacts the thermally conductive flexible member 302, the pad length 320 may be short to contact the optical subassembly 304 where thermal energy is generated and/or retained.

In alternative embodiments, the thermally conductive pad 306 may be contoured such as being contoured to correspond to a shape of the optical subassembly 304 and/or contoured to correspond to a shape of the shell 308. For example, the thermally conductive pad 306 may take a curved shape in embodiments where the optical subassembly 304 takes a cylindrical shape.

The thermally conductive pad 306 can be rigid or deformable. When ridged, the thermally conductive pad 306 can be dimensioned to fit between the optical assembly and the shell without deformation. The thermally conductive pad 306 can be configured as a flexible strip as described herein, with the same dimensions or the thermally conductive pad 306 can be thicker. The dimensions can be suitable for providing thermal coupling between the optical assembly and the shell.

Additionally or alternatively, the thermally conductive pad 306 may be composed of a deformable material. For example, the thermally conductive pad 306 can be compressible, therefore including an expanded volume and a compressed volume. The thermally conductive pad 306 may be configured such that when the optical subassembly 304 is assembled into a communication module, the optical subassembly 304 presses against the thermally conductive pad 306 transferring the thermally conductive pad 306 from the expanded volume to the compressed volume. This configuration may result in improved contact between the thermally conductive pad 306, the optical subassembly 304, and/or the shell 308.

The thermally conductive pad 306 can be composed of a material having a high coefficient of thermal conductivity such as a metal, a thermally conductive polymer, or metal/polymer hybrid. Having a high coefficient of thermal conductivity can enable efficient transfer of thermal energy from the optical subassembly 304 to the shell 308.

Figure 4:
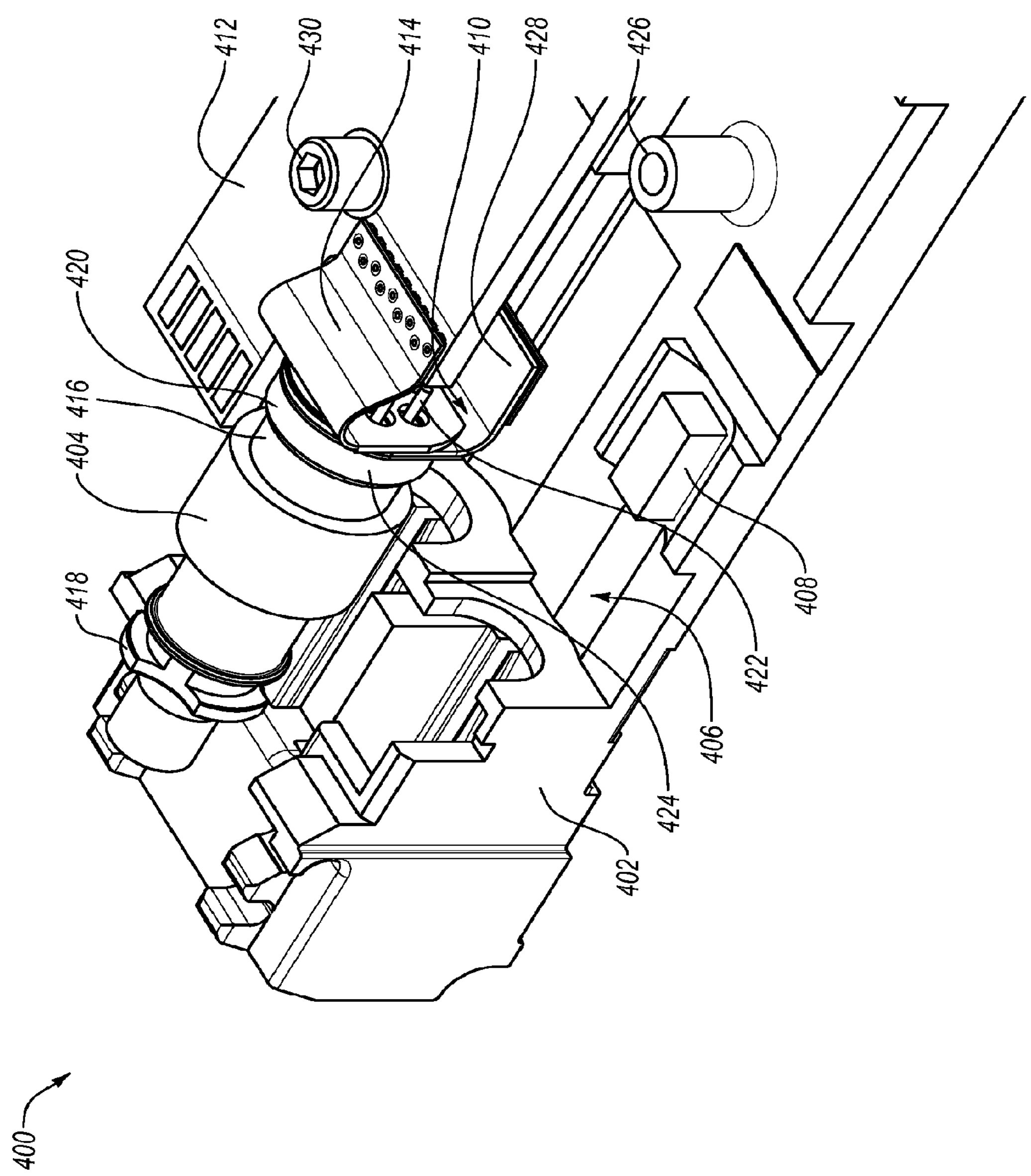
FIG. 4 illustrates a partially exploded view of an example thermal conduction system embodying the block diagram depicted in FIG. 2.

FIG. 4 illustrates a partially exploded view of an example thermal conduction system 400 embodying the block diagram depicted in FIG. 2. Like in the thermal conduction system 200 depicted in the block diagram of FIG. 2, the thermal conduction system 400 is configured to transfer thermal energy from an optical subassembly 404 to a shell 402 through a thermally conductive flexible member 410 and a thermally conductive pad 408. The thermal energy generated in the optical subassembly 404 is transferred through the thermally conductive flexible member 410 and/or through the thermally conductive pad 408 to the shell 402 through thermal conduction.

In the depicted thermal conduction system 400 there is both the thermally conductive flexible member 410 and the thermally conductive pad 408 transferring energy from the optical subassembly 404. However, in alternative embodiments, the thermal conduction system 400 may include either of the thermally conductive flexible member 410 or the thermally conductive pad 408. In yet alternative embodiments, the thermal conduction system 400 may include multiple optical subassemblies 404 which may transfer thermal energy through either or both of the thermally conductive flexible member 410 and/or the thermally conductive pad 408.

Functionally, the shell 402 acts as a thermal sink of the thermal conduction system 400 because the thermally conductive flexible member 410 and the thermally conductive pad 408 contact the shell 402. In addition, the shell 402 defines a cavity 406 configured to receive the optical subassembly 404. To this end, the cavity 406 is configured to correspond generally to the shape of the optical subassembly 404. For example, in the thermal conduction system 400, the cavity 406 includes mostly cylindrical sections such that the optical subassembly 404 may be substantially contained and structurally supported within the cavity 406.

The optical subassembly 404 can include a first end 418 and an opposite second end 416. Generally, the first end 418 is configured for communication of optical signals in a network (not shown), and the second end 416 is configured for electrical interfacing with a PCB 412. That is, electrical signals are received from and/or transmitted to the PCB 412 at the second end 416.

The second end 416 can include a header 420. The header 420 can be substantially cylindrical having two circular surfaces, neither of which is readily visible in FIG. 4. One of the circular surfaces, an interior header surface, is closer to the first end 418. The interior header surface is internal to the optical subassembly 404 and can have a VCSEL and/or other active optical components mounted on the interior header surface. Because the active optical components are mounted on the inner header surface, much of the thermal energy generated through use of the active optical components is transferred to the header 420.

The second of the two circular surfaces, an exterior header surface, is farther from the first end 418 and exterior to the optical subassembly 404. Pins 422 extend from the exterior header surface in the direction away from the first end 418. The pins 422 penetrate the header 420 into the optical subassembly 404 to electrically couple with the active optical components. The pins 422 extend from the exterior header surface and are configured to be electrically coupled to the PCB 412 via a flexible circuit 414.

The thermally conductive flexible member 410 contacts the external header surface. To make effective contact, the thermally conductive flexible member 410 allows the pins 422 to pass through thermally conductive flexible member holes (e.g., the thermally conductive flexible member holes 310). Through this contact, the thermal energy generated by the active optical components mounted on the interior header surface transfers via thermal conduction to the header 420 then to the thermally conductive flexible member 410.

When assembled, that is, when the optical subassembly 404 is received in the cavity 406, the thermally conductive flexible member 410 contacts the shell 402. The contact between the thermally conductive flexible member 410 and the shell 402 allows thermal energy to transfer to the shell 402 via thermal conduction. In one embodiment, the thermally conductive flexible member 410 can be bent such that a transmitting section 428 parallels the cavity 406 of the shell 402.

The header 420 can also include a circumferential exterior header surface 424. The circumferential exterior header surface 424 is essentially the tube-shaped exterior surface between the interior header surface and the exterior header surface. The circumferential exterior header surface 424 can be configured to contact the thermally conductive pad 408 when the optical subassembly 404 is received in the cavity 406.

Additionally, the thermally conductive pad 408 can be disposed in the cavity 406. The thermally conductive pad contacts the cavity 406 of the shell 402 enabling transfer of thermal energy to the shell 402 via thermal conduction.

In alternative embodiments, the thermally conductive pad 408 may instead contact a larger portion of the optical subassembly 404. For example, the thermally conductive pad 408 may contact the entire second end 416 or alternatively extend to the first end 418.

In the thermal conduction system 400, a conductive adhesive such as a conductive adhesive tape may be used to affix the thermally conductive flexible member 410 to exterior header surface, the transmitting section 428 to the shell 402, and/or the thermally conductive pad 408 to the cavity 406 of the shell 402. However, the thermally conductive pad 408 contacts, without being affixed, the circumferential exterior header surface 424.

In alternative embodiments, the thermally conductive flexible member 410 can contact, without being affixed, the exterior header surface. The transmitting section 428 can contact, without being affixed, the shell 402. Likewise, in alternative embodiments, the thermally conductive pad 408 may be affixed to the circumferential exterior header surface 424 and may contact, without being affixed, the cavity 406 of the shell 402.

In yet alternative embodiments, the thermal conduction system 400 can include a means of affixing conductive members within a thermal conduction system. The means of affixing conductive members within a thermal conduction system may be used to affix the thermally conductive flexible member 410 to the exterior header surface; to affix the transmitting section 428 to the shell 402; to affix the thermally conductive pad 408 to the cavity 406 of the shell 402; and to affix the thermally conductive pad 408 to the circumferential exterior header surface 424. Such a means of affixing conductive members within a thermal conduction system may include a thermally conductive adhesive, a thermally conductive epoxy, a mechanical fastener, a mechanical coupling, a press seal, a binding agent, a glue, and/or a magnetic coupling as well as combinations thereof.

FIGS. 5A-5D illustrate an example optical subassembly system 500 that may implement the thermal conduction system depicted in FIG. 4. The optical subassembly system 500 can include an optical subassembly 502 connected to a PCB 510 via a flexible circuit 504 which is separated from a thermally conductive flexible member 508 by a gasket 506. Generally, the flexible circuit 504 electrically couples the optical subassembly 502 to the PCB 510 and the thermally conductive flexible member 508 conducts thermal energy generated in the optical subassembly 502. The gasket 506 separates the flexible circuit 504 from the thermally conductive flexible member 508. The gasket 506 can be thermally insulating.

The optical subassembly 502 may be a TOSA, a ROSA, or another optical subassembly. The function of the optical subassembly 502 may vary substantially without affecting the optical subassembly system 500. However, the optical subassembly system 500 may be best suited in the optical subassemblies 502 that generate a substantial amount of thermal energy.

Additionally or alternatively, a communication module may include a ROSA, a TOSA, and/or another optical subassembly that includes the optical subassembly system 500. For example, a transceiver such as the transceiver 100 depicted in FIG. 1 may include the ROSA 102 and the TOSA 104, each of which include the optical subassembly system 500 described below.

Figure 5A:
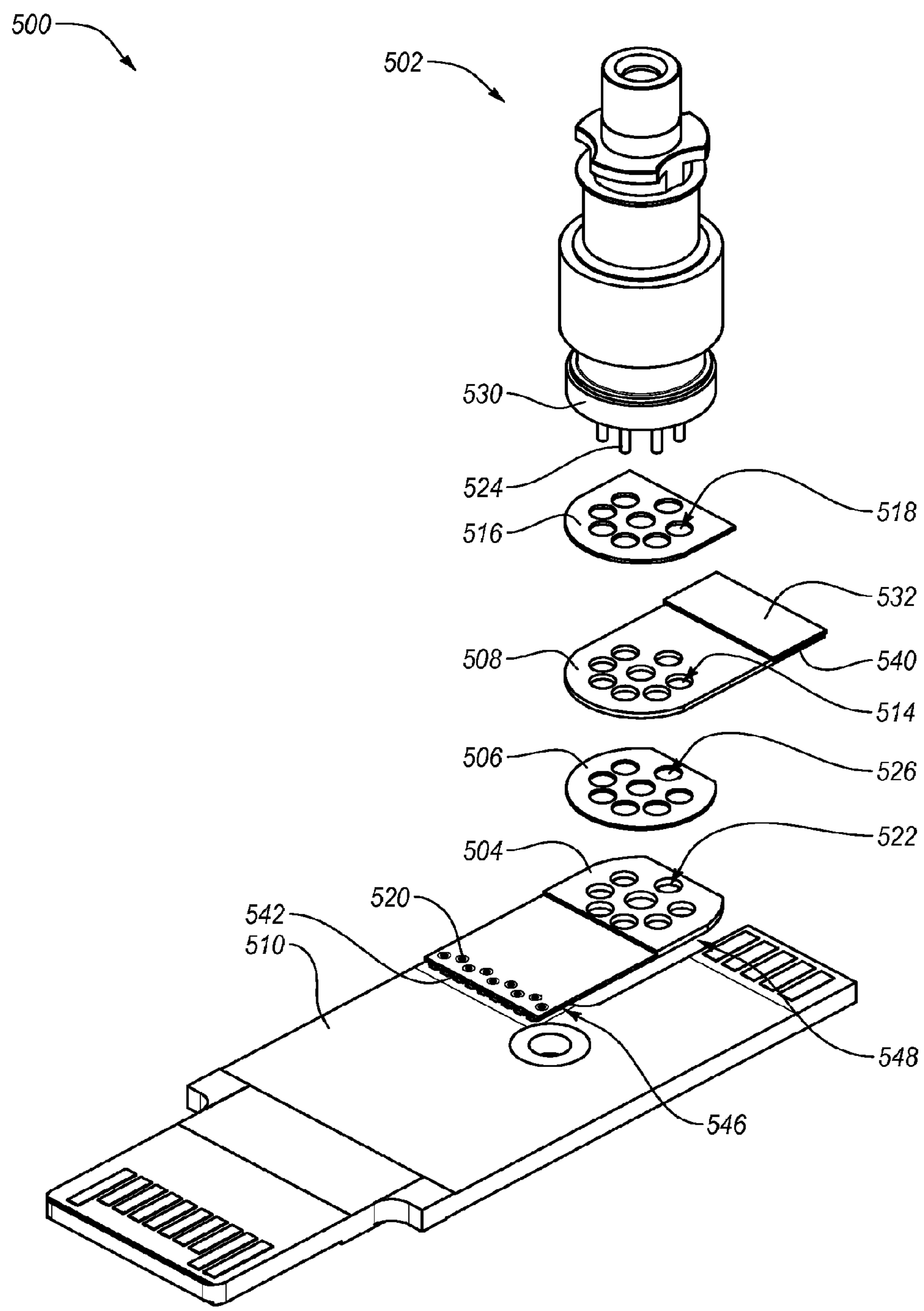
FIGS. 5A-5D illustrate an example optical subassembly system that may be implemented in the thermal conduction system depicted in FIG. 4.
Figure 5B:
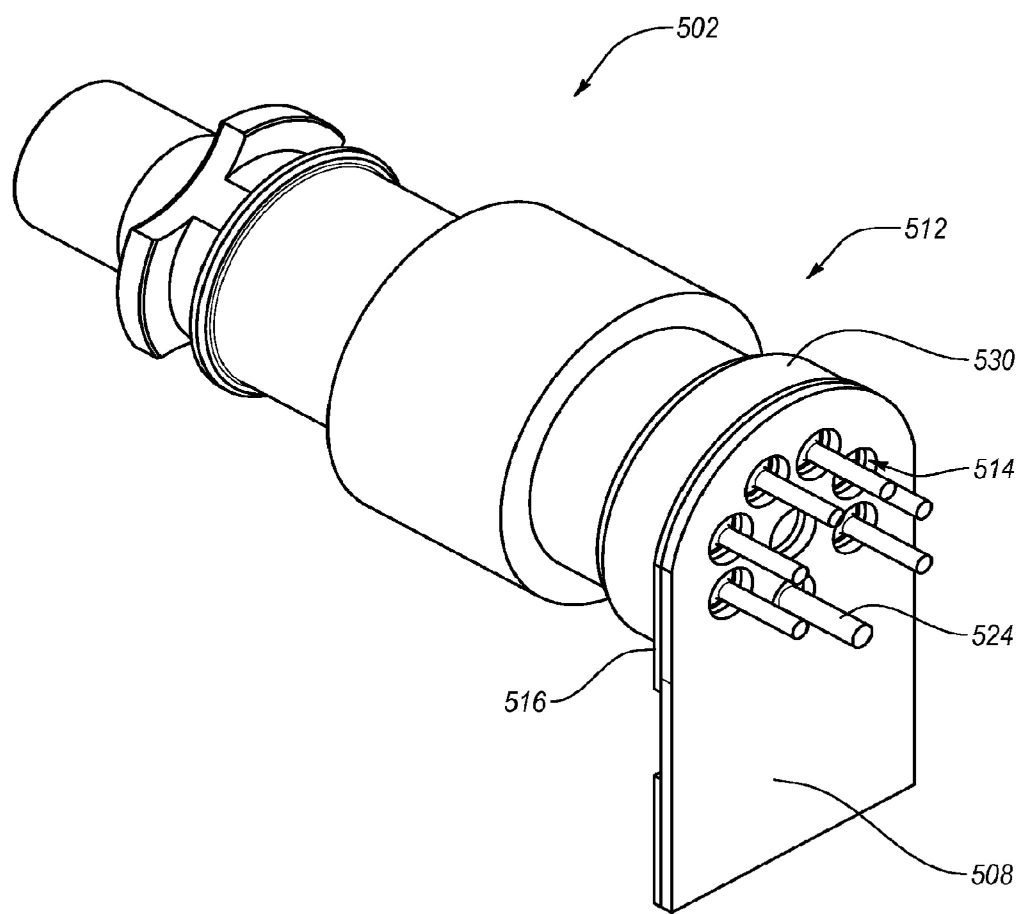
Figure 5C:
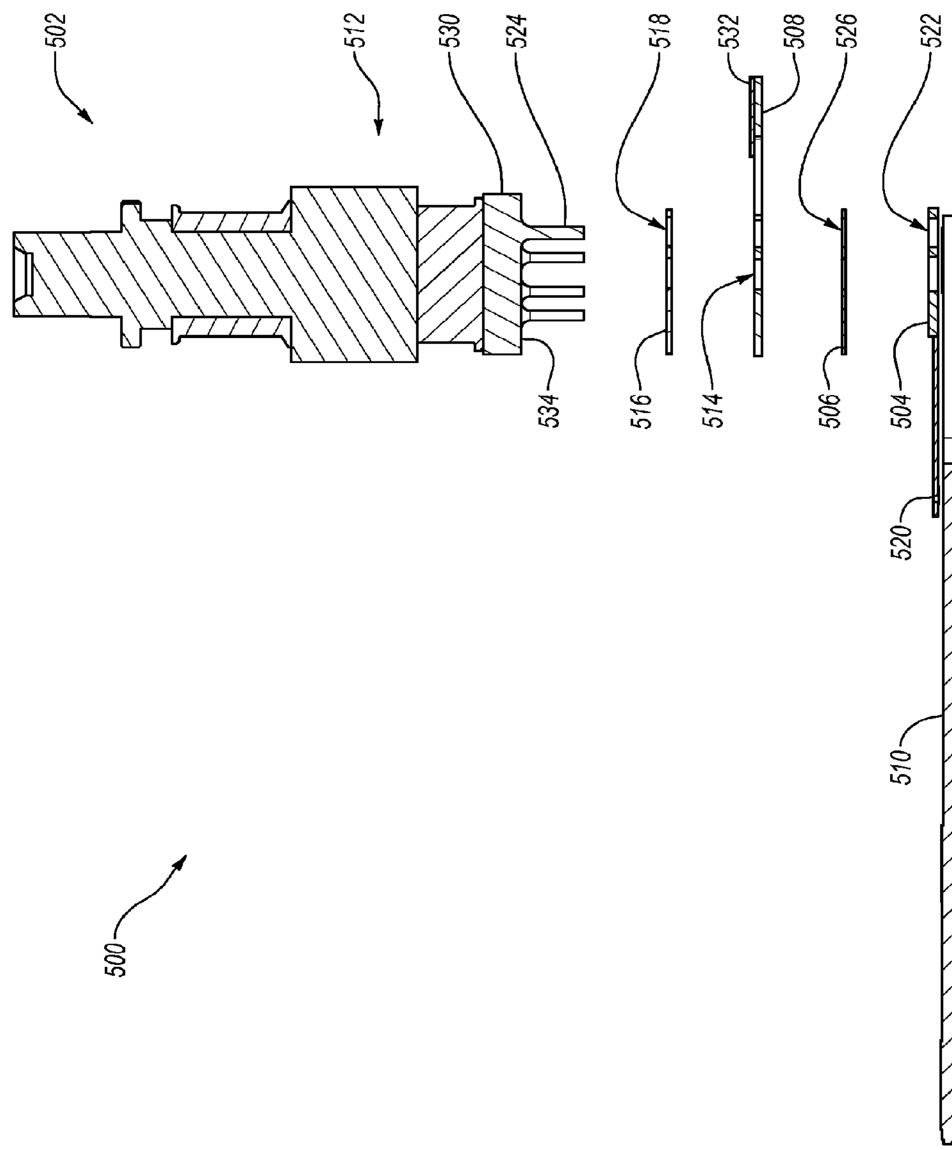
Figure 5D:
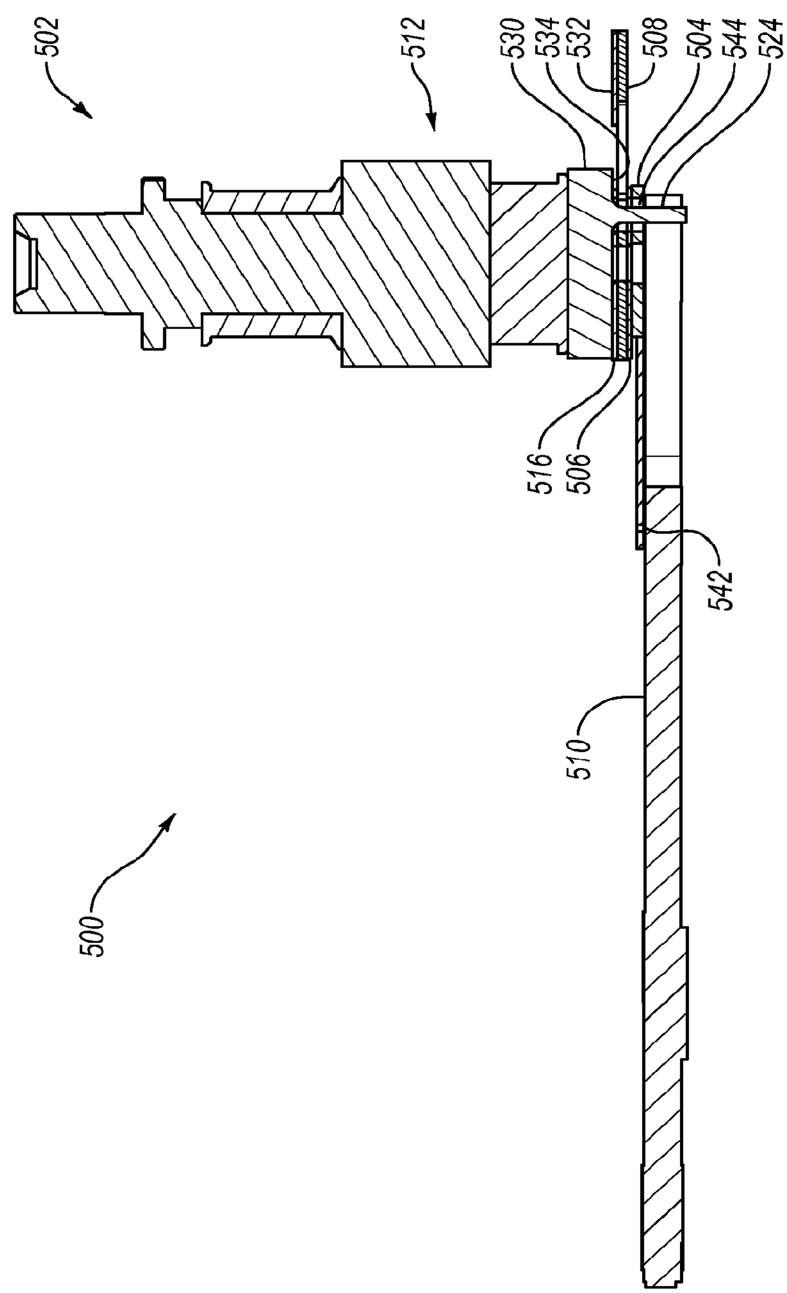

As best illustrated in FIGS. 5A and 5D, the flexible circuit 504 can include two connections. For explanatory convenience, a first connection 542 can include components located at a PCB end 546 of the flexible circuit 504, and a second connection 544 (depicted only in FIG. 5D) can include components and features at an optical subassembly end ("OSA end") 548 of the flexible circuit 504. The first connection 542 can be between the flexible circuit 504 and the PCB 510. The first connection 542 can include electrical coupling and/or mechanical attachment via a set of conductive pads 520. Example methods of making the electrical and/or mechanical connection can include, but is not limited to, a soldering technique. In the embodiment depicted in FIGS. 5A-5D, the conductive pads 520 and an interface between the PCB 510 and the flexible circuit 504 are located at the PCB end 546 of the flexible circuit 504.

The second connection 544 involves components located at the OSA end 548 of the flexible circuit 504 that is located opposite the PCB end 546 of the flexible circuit 504. The second connection 544 can include electrical coupling and/or mechanical attachment between the flexible circuit 504 and the optical subassembly 502. The second connection 544 illustrated in FIGS. 5A-5D can include flexible circuit holes 522 defined at the OSA end 548 of the flexible circuit 504. The flexible circuit holes 522 can correspond to pins 524 that extend from the optical subassembly 502.

The pins 524 can be electric leads configured to electrically connect to active optical components disposed within the optical subassembly 502 and can enable the function of the optical subassembly 502. As best illustrated in FIGS. 5B and 5C, the pins 524 extend axially from a second end 512 of the optical subassembly 502. The pins 524 can generally be a set of cylinders configured parallel to each other and having substantially equivalent lengths. However, in alternative embodiments, the pins 524 may diverge or converge as the pins 524 extend from the second end 512 of the optical subassembly 502. In alternative embodiments, the pins 524 can have shapes alternative to cylinders, may extend radially in some pattern, and may have varying lengths.

The pins 524 can be further configured to pass through the flexible circuit holes 522. With the pins 524 passing through the flexible circuit holes 522, the pins 524 can be soldered to the OSA end 548 of the flexible circuit 504 to create the second connection 544. Similar to the first connection 542, the second connection 544 may be accomplished through a soldering technique or any equivalent technique resulting in an electrically conductive and/or mechanical attachment.

As further illustrated in FIGS. 5A-5D, the gasket 506 of the optical subassembly system 500 may be positioned between the flexible circuit 504 and the thermally conductive flexible member 508. The gasket 506 can be composed of electrically insulating material that may be designed to prevent or reduce electrical conduction between the thermally conductive flexible member 508 and the flexible circuit 504.

With combined reference to FIGS. 4 and 5A-5D, an example of the electrical conduction that the gasket 506 prevents can include short circuits through the thermally conductive flexible member 508. Specifically, an electric signal to or from the PCB 412 may enter the flexible circuit 414 and be communicated to the pins 422. Without the gasket 506, there is a higher possibility that the electrical signal may inadvertently enter the thermally conductive flexible member 508 and short to the shell 402.

Referring again to FIGS. 5A-5D, the gasket 506 is substantially disc-shaped. The shape of the gasket 506 in this and other embodiments may be determined by the shapes of the thermally conductive flexible member 508, the flexible circuit 504, and/or the configuration of the pins 524. That is, the gasket 506 is not limited to a disc shape, and may have, for example, a rectangular, a triangular, or an oval cross-section. Additionally, the gasket 506 defines gasket holes 526 that correspond to the pins 524. Like the flexible circuit holes 522, the pins 524 can be configured to pass through the gasket holes 526.

As best illustrated in FIGS. 5A and 5B, the thermally conductive flexible member 508 is positioned at the second end 512 of the optical subassembly 502. The thermally conductive flexible member 508 defines thermally conductive flexible member holes 514 that can correspond to the pins 524. As with the gasket 506 and the flexible circuit 504, the pins 524 can be configured to pass through the thermally conductive flexible member holes 514.

In the optical subassembly system 500, the thermally conductive flexible member 508 is affixed to the second end 512 of the optical subassembly 502. The second end 512 of the optical subassembly 502 may include a header 530 with an external header surface 534 (FIGS. 5C and 5D only). The header 530 may be composed of a first material selected partially or entirely for conductive or thermal dissipative properties. Alternatively, the header 530 may be coated or plated with a material that may increase thermal dissipative properties of the optical subassembly system 500.

The external header surface 534 of the header 530 may be perpendicular to the direction the pins 524 extend. The external header surface 534 may provide a surface against which the thermally conductive flexible member 508 is affixed. Specifically, in one embodiment the thermally conductive flexible member 508 is affixed to the external header surface 534 by conductive adhesive tape 516. The conductive adhesive tape 516 affixes the thermally conductive flexible member 508 to the external header surface 534 of the header 530. The conductive adhesive tape 516 may define tape holes 518 that can correspond to the pins 524. As with the thermally conductive flexible member 508, the pins 524 can pass through the tape holes 518 defined by the conductive adhesive tape 516.

Additionally or alternatively, the conductive adhesive tape 516 may be composed of a material with conductive properties that allow the transfer of thermal energy from the header 530 of the optical subassembly 502 to the thermally conductive flexible member 508 while creating and maintaining the adhesion between the optical subassembly 502 and the thermally conductive flexible member 508. For example, the conductive adhesive tape 516 may include a bonding agent or any epoxy-like material that can be selected based on thermal conductive properties.

Additionally or alternatively, the thermally conductive flexible member can include a transmitting section 540 as illustrated in FIG. 5A. A second strip of conductive adhesive tape 532 can be placed on the transmitting section 540 such that when assembled in a communication module, the thermally conductive flexible member 508 further affixes to a shell of the communication module. For example, with combined reference to FIGS. 4 and 5A, the thermally conductive flexible member 410 is bent such that the transmitting section 540 is substantially parallel to the shell 402. When the communication module, including the thermal conduction system 400, is assembled, the transmitting section 540 can contact the shell 402.

The second strip of conductive adhesive tape 532 may be made of the same material(s) as the conductive adhesive tape 516 or may be composed of any subset of the materials used in the conductive adhesive tape 516.

Referring to FIG. 5C, a cross-sectional exploded view of the optical subassembly system 500 is depicted. The optical subassembly system 500 may include the optical subassembly 502 with the second end 512. The second end 512 can include the header 530 from which the pins 524 extend axially from the external header surface 534. Additionally, the optical subassembly system 500 can include the conductive adhesive tape 516, the thermally conductive flexible member 508, the gasket 506, and the flexible circuit 504, each of which defines a plurality of holes—the thermally conductive flexible member holes 514, the tape holes 518, the flexible circuit holes 522, and the gasket holes 526—that correspond to the pins 524.

FIG. 5D illustrates the optical subassembly system 500 of FIG. 5C in an assembled configuration. Specifically, when the optical subassembly system 500 is assembled, the pins 524 pass through each of the plurality of holes enabling the conductive adhesive tape 516, the thermally conductive flexible member 508, the gasket 506, and the flexible circuit 504 to be assembled in a stacked-type configuration against the external header surface 534. The stacked-type configuration can include an order or sequence that the conductive adhesive tape 516, the thermally conductive flexible member 508, the gasket 506, and the flexible circuit 504 are positioned on the pins 524. Additionally or alternatively, the stacked-type configuration enables the second connection 544 between the flexible circuit 504 and the pins 524 of the optical subassembly 502 to further mechanically secure the conductive adhesive tape 516, the thermally conductive flexible member 508, and/or the gasket 506.

FIG. 6 illustrates a flowchart of an example installation process 600. With combined reference to FIGS. 5A, 5C, 5D, 4, and the flowchart in FIG. 6, the installation process 600 is described for installing an optical subassembly system such as the optical subassembly system 500 depicted in FIGS. 5A-5D implementing a thermally conductive flexible member into a communication module. The installation process 600 includes one or more acts or operations as illustrated by one or more of blocks 602, 603, 604, 605, 606, 608, 610, 612, 614, 616, 618, and/or 620.

With respect to blocks 602, 603, 604, 605, 606, and 608, the flowchart in FIG. 6 and FIGS. 5A, 5B, and 5D will be referenced.

The installation process 600 can include creating the first connection 542 of the flexible circuit 504 (see block 602). As discussed above, the PCB 510 and the flexible circuit 504 can be soldered or otherwise electrically and/or mechanically coupled. The first connection 542 is created at the set of conductive pads 520.

The installation process 600 can include placing in an order a conductive adhesive such as the conductive adhesive tape 516, the thermally conductive flexible member 508, the gasket 506, and the flexible circuit 504. The order of placement can be substantially as illustrated and described herein. The placing in an order of block 603 relates to the sequence that the conductive adhesive tape 516, the thermally conductive flexible member 508, the gasket 506, and the flexible circuit 504 will be installed onto the optical subassembly 502. For example, the embodiment depicted in FIG. 5A, the ordering beginning with the optical subassembly 502 may include, first, the conductive adhesive tape 516, second, the thermally conductive flexible member 508, third, the gasket 506, and fourth, the flexible circuit 504. However, depending on the particular components included, the ordering may vary. For example, if another means of affixing the thermally conductive flexible member 508 to the optical subassembly 502 other than the conductive adhesive tape 516 is implemented, then the ordering at block 603 can omit the conductive adhesive tape 516.

Each of the conductive adhesive tape 516, the thermally conductive flexible member 508, the gasket 506, and the flexible circuit 504 defines holes that correspond to the pins 524 and allow the pins 524 to pass through. To this end, the installation process 600 includes aligning the pins 524 with the thermally conductive flexible member holes 514 defined in the thermally conductive flexible member 508, the tape holes 518 defined in the conductive adhesive tape 516, the flexible circuit holes 522 defined in the flexible circuit 504, and/or the gasket holes 526 defined in the gasket 506. The alignment generally includes orienting each of the conductive adhesive tape 516, the thermally conductive flexible member 508, the gasket 506, and the flexible circuit 504 such that the holes correspond to the pins 524. As illustrated in FIGS. 5C and 5D, the optical subassembly 502 may be substantially perpendicular to the PCB 510 during the alignment.

The installation process 600 can include passing the pins through the thermally conductive flexible member holes 514, the tape holes 518, the flexible circuit holes 522, and/or the gasket holes 526. The passing the pins through the holes is best illustrated by contrasting FIG. 5C with FIG. 5D. As depicted in FIGS. 5C and 5D, the passing the pins through the holes creates the stacked-type configuration discussed above.

The installation process 600 includes blocks 604 and 605 in which all of the conductive adhesive tape 516, the thermally conductive flexible member 508, the gasket 506, and the flexible circuit 504 are handled together. However, in alternative embodiments, the installation process 600 may include blocks where each of the conductive adhesive tape 516, the thermally conductive flexible member 508, the gasket 506, and/or the flexible circuit 504 is aligned and the pins are passed through independently. For example, rather than aligning all of the conductive adhesive tape 516, the thermally conductive flexible member 508, the gasket 506, and the flexible circuit 504, the conductive adhesive tape 516 may be aligned with the pins 524, then the pins 524 may be passed through the tape holes 518. Next, the thermally conductive flexible member 508 may be aligned with the pins 524, then the pins 524 may be passed through the thermally conductive flexible member holes 514.

At block 606, the installation process 600 can include affixing the thermally conductive flexible member 508 to the external header surface 534. The thermally conductive flexible member 508 can be affixed via the conductive adhesive tape 516. In alternative embodiments, an alternative means for affixing the thermally conductive flexible member 508 to the external header surface 534 may be implemented.

At block 608, the installation process 600 can include creating the second connection 544 of the flexible circuit 504 by coupling the flexible circuit 504 to the pins 524. The second connection 544 can include soldering the flexible circuit 504 to the pins 524 near the flexible circuit holes 522. As discussed above, the second connection 544 enables electrical signals to be communicated between the PCB 510 and the pins 524 via the flexible circuit 504.

In the installation process 600, with blocks 602, 603, 604, 605, 606, and/or 608 completed, the optical subassembly implementing a thermally conductive flexible member may be configured as depicted in FIG. 5D. That is, the optical subassembly 502 can be perpendicular to the PCB 510. In addition, the flexible circuit 504 and the thermally conductive flexible member 508 can be unbent and can be parallel to the PCB 510.

With respect to blocks 610, 612, 614, 616, 618, and/or 620, the flowchart in FIG. 6 and FIG. 4 will be referenced. The installation process 600 can include bending the flexible circuit 414. By bending the flexible circuit 414, a hairpin-like bend is created in the flexible circuit 414 such that the optical subassembly 404 is oriented parallel to the PCB 412. Additionally, the optical subassembly 404 may be positioned some distance from the PCB 412 such that the pins 422 are between the PCB 412 and the optical subassembly 404.

At block 612, the installation process 600 can include bending the thermally conductive flexible member 410. The thermally conductive flexible member 410 can be bent to a substantially right angle. In this configuration, the thermally conductive flexible member 410 includes a receiving section affixed to the external header surface that can be normal to the transmitting section 428 extending towards the PCB 412. The transmitting section 428 can be parallel to the PCB 412 and the cavity 406 of the shell 402.

At block 614, the installation process 600 can include positioning the thermally conductive pad 408 in the cavity 406 of the shell 402. Additionally, the thermally conductive pad 408 may be affixed to the cavity 406 of the shell 402. In alternative embodiments, an alternative means for affixing the thermally conductive pad 408 to the cavity 406 of the shell 402 may be implemented. Alternatively, block 614 may be entirely omitted in embodiments where the thermally conductive pad 408 is omitted.

The installation process 600 can include positioning the optical subassembly implementing a thermally conductive flexible member in the cavity 406 (see block 616). The cavity 406 is configured to receive the optical subassembly implementing a thermally conductive flexible member. Additionally, the shell 402 may define an internally threaded cylinder 426. The internally threaded cylinder 426 may be configured to receive a PCB fastener 430 that penetrates the PCB 412 such that the optical subassembly implementing a thermally conductive flexible member is secured to the shell 402.

At block 618, the installation process 600 can include affixing the transmitting section 428 of the thermally conductive flexible member 410 to the cavity 406 of the shell 402. The thermally conductive flexible member 410 can be affixed via the conductive adhesive tape. In alternative embodiments, an alternative means for affixing the transmitting section 428 of the thermally conductive flexible member 410 to the cavity 406 of the shell 402 may be implemented. Alternatively still, block 618 may be omitted and the transmitting section 428 of the thermally conductive flexible member 410 may contact without affixing the cavity 406 of the shell 402.

At block 620 the installation process 600 can include positioning the optical subassembly implementing a thermally conductive flexible member such that the optical subassembly 404 contacts the thermally conductive pad 408. In some embodiments, block 620 may include orienting the optical subassembly 404 such that the circumferential exterior header surface 424 contacts the thermally conductive pad 408. In embodiments not implementing the thermally conductive pad 408, block 620 may be omitted. Alternatively, block 620 may include affixing the thermally conductive pad 408 to the optical subassembly 404.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A thermal conduction system for thermal energy dissipation, the thermal conduction system comprising:

a thermally conductive flexible member that contacts an optical subassembly that is positioned in a shell of a communication module and that contacts the shell such that the thermal energy generated by operation of the optical subassembly transfers from the optical subassembly to the shell;

thermally conductive flexible member holes that are defined by the thermally conductive flexible member, the thermally conductive flexible member holes corresponding to pins that extend from the optical subassembly such that the pins pass through the thermally conductive flexible member holes and enable the thermally conductive flexible member to contact an exterior header surface of a header of the optical subassembly; and a gasket that defines gasket holes, the gasket holes corresponding to the thermally conductive flexible member holes and to flexible circuit holes of a flexible circuit, the gasket configured to be positioned between the thermally conductive flexible member and the flexible circuit to reduce electrical conduction between the thermally conductive flexible member and the flexible circuit.

2. The thermal conduction system of claim 1, further comprising:

a thermally conductive pad that contacts the optical subassembly and the shell of the communication module such that the thermal energy generated by operation of the optical subassembly transfers from the optical subassembly to the shell.

3. The thermal conduction system of claim 2, wherein:

the optical subassembly includes a circumferential exterior header surface, and the thermally conductive pad contacts the optical subassembly at the circumferential exterior header surface.

4. The thermal conduction system of claim 3, further comprising adhesive tape that defines tape holes that correspond to the gasket holes and the thermally conductive flexible member holes, wherein the adhesive tape affixes the thermally conductive flexible member to the optical subassembly.

5. The thermal conduction system of claim 4, further comprising a second strip of conductive adhesive tape that is placed on a transmitting section of the thermally conductive flexible member, wherein the second strip of conductive adhesive tape affixes the thermally conductive flexible member to the shell.

6. The thermal conduction system of claim 1 wherein the thermally conductive flexible member is bent such that a transmitting section of the thermally conductive flexible member is substantially parallel to and contacts the shell when the communication module is assembled.

7. The thermal conduction system of claim 1, wherein the thermally conductive flexible member includes two or more layers affixed together.

8. The thermal conduction system of claim 3, wherein:

the header of the optical subassembly is composed of a first material; and at least one of the thermally conductive flexible member or the thermally conductive pad is composed of a second material, the second material having a higher thermal conductivity than the first material.

9. The thermal conduction system of claim 1, wherein:

the thermally conductive flexible member defines a slot; and the slot extends from one of the thermally conductive flexible member holes.

10. The thermal conduction system of claim 1, wherein:

thermally conductive flexible member includes a receiving section that is circular and a transmitting portion that is rectangular;

the thermally conductive flexible member holes are defined in the receiving section; and the transmitting portion contacts the shell.

11. A thermal conduction system comprising:

a thermally conductive flexible member that contacts an optical subassembly that is positioned in a shell of a communication module and that contacts the shell such that a portion of thermal energy generated by operation of the optical subassembly transfers from the optical subassembly to the shell via thermal conduction, the thermally conductive flexible member defining thermally conductive flexible member holes that correspond to pins that extend from the optical subassembly such that the pins pass through the thermally conductive flexible member holes and enable a portion of the thermally conductive flexible member to contact an exterior header surface of a header of the optical subassembly;

a gasket that defines gasket holes, the gasket holes corresponding to the thermally conductive flexible member holes and to flexible circuit holes of a flexible circuit, the gasket configured to be positioned between the thermally conductive flexible member and the flexible circuit to reduce electrical conduction between the thermally conductive flexible member and the flexible circuit; and a thermally conductive pad that contacts a circumferential exterior header surface of the header of the optical subassembly and the shell of the communication module such that another portion of the thermal energy generated by operation of the optical subassembly transfers from the optical subassembly to the shell via conduction through the thermally conductive pad.

12. The thermal conduction system of claim 11, further comprising adhesive tape that defines tape holes that correspond to the gasket holes and the thermally conductive flexible member holes, wherein the adhesive tape is configured to affix the thermally conductive flexible member to the exterior header surface of the header.

13. The thermal conduction system of claim 12, further comprising a second strip of conductive adhesive tape that is placed on a transmitting section of the thermally conductive flexible member opposite the portion of the thermally conductive flexible member in which the thermally conductive flexible member holes are defined, wherein the second strip of conductive adhesive tape is configured to affix the transmitting section of thermally conductive flexible member to the shell.

14. The thermal conduction system of claim 13, wherein the transmitting section of thermally conductive flexible member is bent such that second strip of conductive adhesive tape is substantially parallel to and contacts the shell when the communication module is assembled.

15. The thermal conduction system of claim 11, wherein the thermally conductive flexible member includes two or more layers affixed together.

16. The thermal conduction system of claim 11, wherein:

the header of the optical subassembly is composed of a first material; and at least one of the thermally conductive flexible member and the thermally conductive pad is composed of a second material, and the second material having a higher thermal conductivity than the first material.

17. The thermal conduction system of claim 11, wherein the thermally conductive flexible member defines a slot that extends from one of the thermally conductive flexible member holes.

* * * * *

UNITED STATES PATENT AND TRADEMARK OFFICE

CERTIFICATE OF CORRECTION

PATENT NO. : 9,572,283 B2
APPLICATION NO. : 14/571071
DATED : February 14, 2017
INVENTOR(S) : Tat Ming Teo, Troy Wy Piew Chiang and JianBing Zhao It is certified that error appears in the above-identified patent and that said Letters Patent is hereby corrected as shown below:

In Column 3, Line 55, delete “and principle” and insert -- and principles --.
In Column 8, Line 13, delete “material maybe” and insert -- material may be --.
In Column 8, Line 49, delete “additionally” and insert -- additional --.
In Column 9, Line 8, delete “greater that” and insert -- greater than --.
In Column 13, Line 29, delete “to exte-” and insert -- to the exte- --.
In Column 20, Line 28, delete “thermally” and insert -- the thermally --.
In Column 21, Line 13, delete “of thermally” and insert -- of the thermally --.
In Column 21, Line 14, delete “that second” and insert -- that the second --.

Signed and Sealed this
Fourth Day of December, 2018

Andrei Iancu
*Director of the United States Patent and Trademark Office*